United States Patent
Beermann

(10) Patent No.: US 12,224,762 B2
(45) Date of Patent: *Feb. 11, 2025

(54) MEASUREMENT UNIT CONFIGURED TO PROVIDE A MEASUREMENT RESULT VALUE

(71) Applicant: Advantest Corporation, Tokyo (JP)

(72) Inventor: Andreas Beermann, Stuttgart (DE)

(73) Assignee: Advantest Corporation, Tokyo (JP)

(*) Notice: Subject to any disclaimer, the term of this patent is extended or adjusted under 35 U.S.C. 154(b) by 243 days.

This patent is subject to a terminal disclaimer.

(21) Appl. No.: 17/733,427

(22) Filed: Apr. 29, 2022

(65) Prior Publication Data

US 2022/0263517 A1     Aug. 18, 2022

Related U.S. Application Data

(63) Continuation of application No. PCT/EP2020/062795, filed on May 7, 2020.

(51) Int. Cl.
| | |
|---|---|
| *H03M 1/50* | (2006.01) |
| *G04F 10/00* | (2006.01) |
| *H03M 1/06* | (2006.01) |
| *H03M 1/10* | (2006.01) |

(52) U.S. Cl.
CPC ........ *H03M 1/0658* (2013.01); *G04F 10/005* (2013.01); *H03M 1/1071* (2013.01)

(58) Field of Classification Search
CPC .... H03M 1/0658; H03M 1/1071; H03M 1/12; H03M 1/50; H03M 1/0634; G04F 10/005
USPC ........................................................ 341/166
See application file for complete search history.

(56) References Cited

U.S. PATENT DOCUMENTS

| | | | |
|---|---|---|---|
| 6,326,909 B1* | 12/2001 | Yamaguchi | H03M 1/1095 341/120 |
| 2008/0247451 A1* | 10/2008 | Yamaguchi | H03M 1/0836 375/226 |
| 2016/0305838 A1 | 10/2016 | Wiesbauer et al. | |
| 2018/0115406 A1 | 4/2018 | Moore et al. | |

FOREIGN PATENT DOCUMENTS

EP    2796945 A1    10/2014

* cited by examiner

*Primary Examiner* — Jean B Jeanglaude

(57) ABSTRACT

A measurement unit is disclosed and includes a converter unit and a processing unit is configured to provide a measurement result value, based on a first input signal and a second input signal.

The converter unit is configured to provide a first digital, quantized values based on the first input signal or derived from the first input signal and the second input signal. The converter unit is further configured to provide second digital, quantized values based on the second input signal. The measurement unit is configured to change the one or more control signals of the converter unit between determination of different first values or a determination of the different second values, wherein different first values and/or different second values are provided using different converter quantization step sizes.

36 Claims, 2 Drawing Sheets

MEASUREMENT UNIT CONFIGURED TO PROVIDE A MEASUREMENT RESULT VALUE

CROSS-REFERENCES TO RELATED APPLICATIONS

This application is a continuation of copending International Application No. PCT/EP2020/062795, filed May 7, 2020, which is incorporated herein by reference in its entirety.

DESCRIPTION

Technical Field

The present invention relates to a measurement unit configured to provide a measurement result value. The present invention relates to a measurement unit comprising a digital converter unit, such as an analog-to-digital converter (ADC) or a time-to-digital converter (TDC) unit. The present invention relates to improving the resolution of time-to-digital and/or analog-to-digital conversion measurements.

Background of the Invention

Modern analog-to-digital converters (ADC) and/or time-to-digital converters (TDC) have a fixed resolution of the digital output signal determined by the discrete values of the measurement result. In some cases the resolution of such converters, ADC and/or TDC, is not sufficient.

Common approaches to increase the converter resolution are oversampling and dithering.

Oversampling means sampling with a higher frequency, then decimating the signal with a digital low-pass filter. This approach fails for static signals, such as DC levels, because the converter will always measure the same values so that low-pass filtering over a larger amount of measurements will still result in the same value.

In some cases, both clocks have a constant phase shift and frequency, thus having a static (='DC') signal. This means that simple averaging of a higher number of measurement results does not increase the measurement resolution.

Dithering uses the same approach as oversampling but with artificial noise added to the measured signal to allow some averaging in the low-pass filter. It works for DC signals as well but the noise signal and the low-pass filtering cutoff frequency have to be chosen carefully to eliminate the noise signal completely by filtering.

For time to digital converters the dithering approach is hard to implement because adding noise in the time domain means adding jitter. Jitter is not easy to apply to an existing clock in a controlled way. As a consequence this option has been dropped.

There is a need for improving the resolution of a digital conversion measurement.

SUMMARY OF THE INVENTION

In an embodiment according to an aspect of the invention, a measurement unit is provided (see, for example, claim 1) configured to provide a measurement result value, such as $$\frac{\Sigma T_{edge}(k)}{\Sigma T_{period}(k)},$$

based on a first input signal, such as clock 1 signal or a voltage signal of a temperature dependent resistor, and a second input signal, such as clock 2 signal, or a voltage signal of a reference resistor. The measurement unit comprises a converter unit, such as TDC or ADC, and a processing unit or an averaging unit.

The converter unit, such as TDC, ADC, is configured to provide first digital, quantized values, such as $T_{edge}$, $V_{ref-R}$, based on the first input signal or derived from the first input signal and the second input signal.

The converter unit is further configured to provide second digital, quantized values, such as $T_{period}$, $V_{PTC}$, based on the second input signal or derived from the first input signal and the second input signal.

The quantization step size, or the TDC delay stages delay time unit, of the first values and the second values are based on one or more control signals, such as the delay stages supply voltage, or $V_{ref}$ of the ADC converter unit.

The measurement unit is configured to change the one or more control signals of the converter unit between determination of different first values and/or a determination of the different second values, such that different first values and/or different second values are provided using different converter quantization step sizes.

The processing unit or the averaging unit is configured to provide a measurement result value from a predefined number of first values and a predefined number of second values, such that, an impact of the converter quantization step sizes onto the first values and onto the second values cancels out, at least partially.

A first input signal and a second input signal is provided to a measurement unit. The measurement unit comprises a converter unit and a processing unit. The first input signal and the second input signal is provided to the converter unit of the measurement unit.

The converter unit is configured to provide first digital quantized values and second digital quantized values based on the first input signal and/or the second input signal and/or is derived from the first input signal and the second input signal.

The quantization step sizes of the first values and the quantization step sizes of the second values are based on one or more control signals. The one or more control signals of the converter unit are changed between a determination of different first values and/or a determination of different second values, thus resulting in different first values and/or different second values. In other words, different first values and/or different second values are provided by using different control signals of the converter unit.

The first values and the second values are provided to the processing unit or averaging unit. The processing unit collects a predefined number of first values and a predefined number of second values. The processing unit provides a measurement result from the predefined number of first values and from the predefined number of second values, such that an impact of the quantization step sizes onto the first values and onto the second values cancels out. The measurement results provided by the processing unit is the measurement result of the measurement unit.

In a preferred embodiment (see, for example, claim 2), a reference value is a value of a constant and known second input signal, such as a value of $T_{period}$, or a value of $R_{ref}$ of the measurement unit and the second values are determined by measuring the second input signal with the same converter unit as used for measuring the first input signal.

A second input signal can be a known and/or constant input signal, such as a reference signal or a reference value.

A value of $T_{period}$, or a value of $R_{ref}$, can be an exemplary reference value measured by the same converter unit as used for the first input signal.

Using constant reference signals as second input signals makes changes in the first input signal more visible when comparing it, by using a division operation, with the constant reference second input signal.

In a preferred embodiment (see, for example, claim 3), the quantization step size is calculated from the value of the control signal, e.g. by dividing the control signal voltage level by the total number of quantization steps.

The quantization step can be defined by corresponding the range of the control signal to the range of the possible quantization step size and corresponding the control signal value to the quantization step size value. Thus allowing a control of the quantization step size by the control signal.

In a preferred embodiment (see, for example, claim 4), the processing unit is configured to determine the measurement result value on the basis of the first values and on the basis of the second values using an averaging.

Using an averaging in the process of providing a measurement result value from a predefined number of first values and a predefined number of second values reduces the number of values from a predefined number to one measurement result value. In other words, the predefined number of first values and/or the predefined number of second values can be reduced, for example, to one single value with the usage of averaging.

In a preferred embodiment (see, for example, claim 5), the processing unit is configured to average quotient values of the first values and the second values, in order to obtain the measurement result value.

Averaging the quotient values of first values and second values leads to a single measurement result value, affected by all the quotient values.

According to an embodiment (see, for example, claim 6), the processing unit is configured to calculate the measurement result value based on a following equation:

$$\text{result} = \frac{1}{n} \cdot \sum_{k=1}^{n} \frac{val_1(k)}{val_2(k)}$$

In the equation above:
result represents the measurement result value,
n represents the predefined number of measurements,
$val_1(k)$ represents the k-th element of the predefined number of first values,
$val_2(k)$ represents the k-th element of the predefined number of second values,
k represents a running variable.

According to an embodiment (see, for example, claim 7), the processing unit is configured to calculate a quotient value of a sum of the first values and a sum of the second values or a quotient value of an average of the first values and an average of the second values, in order to obtain the measurement result value.

A quotient value of a sum of the first values and a sum of the second values can be approximated by calculating the quotient value of an average of the first values and an average of the second values.

Calculating the quotient value of an average of the first values and an average of the second values is an approximate solution, which has some deviation to the solution of calculating the sum of the quotients, especially when the distribution of the converter step size values is asymmetric.

However, the approximation is good enough or even better, because it does not suffer from rounding errors that occur when summing up the quotients. Quotients are fractional numbers, being rounded after a certain number of digits. When summing up the quotients, rounding errors are summing up as well.

Calculating a quotient value of a sum of the first values and a sum of the second values need far less mathematical division operations, than calculating the average of the quotient values of the first values and the second values. The reduction of the mathematical division operations results in a faster calculation and/or a reduction of the processing power needed to conduct the calculations.

Although the computation complexity is reduced drastically, simulations show that a computation accuracy similar to the computation accuracy of an average quotient value of the first values and the second values can be achieved.

In a preferred embodiment (see, for example, claim 8), the processing unit is configured to calculate the measurement result value based on a following equation:

$$\text{result} = \frac{\sum_{k=1}^{n} val_1(k)}{\sum_{k=1}^{n} val_2(k)}$$

In the equation above:
result represents the measurement result value,
n represents the predefined number of measurements,
$val_1(k)$ represents the k-th element of the predefined number of first values,
$val_2(k)$ represents the k-th element of the predefined number of second values,
k represents a running variable.

According to embodiments (see, for example, claim 9), the one or more control signals are control voltage signals and/or control current signals.

Using control voltage signals and/or control current signals as control signal in a measurement unit, results in a control signal, which can be set accurately.

In a preferred embodiment (see for example claim 10), the one or more control signals comprise an increasing and/or decreasing ramp signal or a sawtooth signal, and/or a periodically increasing and decreasing triangular signal, and/or a signal based on a mathematical function, such as sine wave, and/or a random, and/or pseudo random signal, and/or an arbitrary waveform stored in a memory.

Adapted to an actual use case, several different types of wave forms can be used as a control signal. Being flexible with the wave form applied results in being adaptive to different measurement situations.

According to embodiments (see for example claim 11), the measurement unit comprises a control signal generator.

The measurement unit can receive the control signal from an external source and/or could have its own control signal generator. A control signal generator, for example a voltage generator and/or a current generator, can be controlled by the measurement unit in order to adapt the measurement conditions to the actual environment.

In a preferred embodiment (see for example claim 12), the measurement unit comprises a control logic, configured to control and/or oversee and/or supervise the converter unit and/or the processing unit and/or the one or more control signals.

The control logic of the measurement unit may trigger the control signal generator unit to set a new control voltage or a new control current level for the next measurement. Furthermore, the control logic triggers the converter unit to conduct a measurement. Moreover, the control logic can trigger a measurement unit to accumulate first values and second values and conduct an averaging operation. In other words, the control unit align or harmonize the operation of the signal generator unit, of the converter unit and of the processing unit.

In a preferred embodiment (see for example claim 13), the first input signal and the second input signal are stationary over a predefined number of measurements.

Static and/or constant input signals can be measured with the measurement unit. To make the measurement non-static the control signal of the converter unit is changed from measurement to measurement, by the control logic, if available. The processing unit accumulates the first values and the second values provided by the converter unit and conducts an averaging operation, wherein an impact of the changing quantization step sizes cancels out, at least partially.

In a preferred embodiment (see for example claim 14), the converter unit is a time-to digital converter or an analog-to-digital converter.

The measurement unit is generic and can comprise different types of converters for example, a TDC or an ADC. The measurement unit can be used in applications where the final measurement result is a quotient between two values in a way that the changing control signals of the converter or the actual quantization step sizes are cancelled out by the division.

According to embodiments (see for example claim 15), the converter unit is a TDC providing time values from an edge of the first input signal to an edge of the second input signal or second clock signal, and/or time values of a period of the first input signal or first clock signal or a period of the second input signal or second clock signal.

The converter unit of the measurement unit can be a TDC with two clock signals as input signals. The TDC provides two outputs, a time value from an edge of the first input signal or first clock signal to an edge of the second input signal or second clock signal, and/or time values of a period of the first input signal or first clock signal or a period of the second input signal or second clock signal.

In a preferred embodiment (see for example claim 16), the quantization step sizes of the time value of a period of the first input signal, or first clock signal, or the time value of a period of the second input signal, or second clock signal, and the quantization step sizes of the time value between the edge of the first signal or first clock signal and the edge of the second signal or second clock signal are varied.

Variation in the quantization step sizes will result in a different time value of a period of the first input signal or the time value of a period of the second input signal and the time value between the edge of the first signal and the edge of the second signal even if only the quantization step sizes are varied. Keeping the input signals the same and varying the quantization step sizes will result in different output values.

According to embodiments (see for example claim 17), the result value is a phase deviation between the first input signal and the second input signal.

A possible measurement result value of the measurement unit is a phase deviation between the first input signal and the second input signal. The phase deviation can be calculated by a quotient between the time deviation of two clock signal edges and a clock period. With the help of the division the quantization step sizes cancel out from the calculation.

In a preferred embodiment (see for example claim 18), the first input signal is a clock signal and/or the second input signal is a clock signal.

Using a TDC as a converter unit, inputs are required to be time related inputs. Clock signals are time related inputs, allowing precise measurement of the passing time within a predefined error range.

In a preferred embodiment (see for example claim 19), the frequency of the first input signal and the frequency of the second input signal are the same or substantially similar or where a ratio between the frequency of the first input signal and the frequency of the second input signal is equal to a ratio between a first integer number and a second integer number being smaller than 20.

A simple rational relation between the frequency of the first input signal and the frequency of the second input signal, such as being the same or similar, or one of the frequencies is an integer multiple of the other one resulting in a static phase deviation or in a static measurement result value.

The relation between the frequencies of the first and second input signals can be corrected, thus avoiding additional mathematical errors related to nearly constant time shifts, or time shifts with a linear relation between the first and second input signals.

In a preferred embodiment (see for example claim 20), the one or more control signals of the converter unit change time unit.

Changing the time unit results in small changes in the measured time values, such as period values and/or edge to edge time differences. Conducting several measurements with slightly different time units result in slightly different measured time values. Averaging the slightly different measured time values will provide a time output value with a better resolution.

According to an embodiment (see for example claim 21), the one or more control signals of the converter unit varies or adjusts frequency of one or more oscillators, or ROs, which act as a time reference, defining temporal quantization step sizes. For example, a voltage control signal of the converter unit varies or adjusts frequency of one or more voltage controlled oscillators (VCO).

The converter unit of the measurement unit comprises an oscillator or a RO. The oscillator defines the temporal quantization step sizes, or the time references, which can be varied by changing the control signal of the converter unit. Having an oscillator in the converter unit makes it easier to adjust or vary the time reference or the quantization step sizes.

In a preferred embodiment (see for example claim 22), the one or more control signals of the converter unit varies or adjusts a supply voltage or a supply current of an oscillator or RO in order to vary the quantization step sizes.

The measured signals are converted into non-static signals by changing the quantization step sizes. The quantization step sizes are set and/or varied by a variation of the control signal of the supply voltage or a supply current of the oscillator or RO. The electrical supply of the oscillator is the control signal of the converter unit. By varying the control signal of the converter, i.e., the supply voltage or supply current of the oscillator or RO, the quantization step sizes will vary.

According to embodiments (see for example claim 23), the converter unit or the quantization of the converter unit is based on delay stages.

Stage delays can be used for continuously measuring the time between an edge of the first clock signal to the edge of the second clock signal and/or to measure the time of the full clock period of the clock signals. The measurements can be done simultaneously and the result will be in the units of the stage delay.

In a preferred embodiment (see for example claim 24), the one or more control signals of the converter unit varies or adjusts the delay value of delay stages of a chain or a ring of delay stages in order to vary the quantization step sizes.

The converter unit of the measurement unit can comprise, for example, a RO with more than one delay stage. Varying one or more control signals of the converter unit can adjust one or more delays of a chain or a ring of delay stages. The resolution of a single measurement of an oscillator based converter unit is determined by the stage delay of the oscillator. The oscillator stage delay can be changed in small ranges by varying the supply voltage or supply current of the oscillators delay stages.

In a preferred embodiment (see for example claim 25), the quantization step sizes, e.g. the stage delay value, are varied by at least 5%, by at least 50%, by at least 100% or by at least 150%.

The variation of the quantization step sizes or the stage delay values is adaptable to different measurement requirements.

In a preferred embodiment (see for example claim 26), the quantization step sizes are varied such that the digitized first value and/or the digitized second value change for a stationary first signal and/or a stationary second signal, in response to the change of the quantization step size.

Even if the first input value and/or the second input value is static, the variation or change of the quantization step sizes result in a variation of the digitized first values and/or the digitized second values. Conducting an averaging operation on the different digitized first values and/or digitized second values based on different quantization step sizes results in an improved resolution of the measurement result value.

In a preferred embodiment (see for example claim 27), the converter unit is an analog-to-digital converter, providing first voltage or current values from a first input signal and second voltage or current values from a second input signal.

The measurement unit is a generic measurement unit, which can comprise an analog-to-digital converter as a converter unit. The ADC provides first digital and second digital voltage and/or current signals from a first and/or second input signal. A wide variety of off-the-shelf ADCs exist to be used in the measurement unit.

According to embodiments (see for example claim 28), the quantization step size of the first voltage or current values and/or the second voltage or current values are varied.

The measured signals are converted into non-static signals by modifying the quantization step sizes. Changing the quantization step sizes results in slightly different digital values. Conducting an averaging operation on the slightly different and digital values improves the resolution of the calculated measurement result value.

In a preferred embodiment (see for example claim 29), the result value is a quotient value.

Using a quotient value as a measurement result value has the benefit of the cancellation of the quantization step sizes. Thus the selection of a quantization step size does not affect the measurement result value.

In a preferred embodiment (see for example claim 30), the first input signal is a voltage or a current signal and/or the second input signal is a voltage or a current signal.

Voltage or a current signals are used as a first and/or second signal, resulting in precise measuring.

In a preferred embodiment (see for example claim 31), the one or more control signals of the converter unit change voltage or current reference, or voltage or current unit.

The voltage or current reference or voltage or current unit is dependent on the control signals of the converter unit. The voltage or current unit is cancelled out by a division operation.

In a preferred embodiment (see for example claim 32), the one or more control signals of the converter unit varies or adjusts a supply voltage or a supply current of an ADC in order to vary the quantization step sizes.

The supply voltage or a supply current of an ADC is adjusted in order to provide different or slightly different quantization step sizes, providing different first digital values and different second digital values. The quantization step size cancels out in a division operation.

According to embodiments (see for example claim 33), the quantization step size, e.g., voltage or current steps, are varied by at least 5%, by at least 50%, by at least 100% or by at least 150%.

The variation of the quantization step size is adaptive, according to the actual measurement environment.

In a preferred embodiment (see for example claim 34), the quantization step sizes are varied such that, the digitized first voltage or current values and/or the digitized second voltage or current values change for a stationary first signal and/or a stationary second signal, in response to the change of the quantization step size.

Even if the first signal and/or the second signal are stationary, a change in the quantization step sizes results in a change in the digitized first voltage or current values and/or a change in the digitized second voltage or current values. By changing the quantization step size, the input signals are converted into non-static signals.

The features and/or functionalities and/or details described herein can be applied both individually and taken in combination.

BRIEF DESCRIPTION OF THE FIGURES

In the following embodiments of the present disclosure are described in more detail with reference to the figures in which.

DETAILED DESCRIPTION OF THE EMBODIMENTS

In the following, different inventive embodiments and aspects will be described. Also, further embodiments will be defined by the enclosed claims.

It should be noted that any embodiments as defined by the claims can be supplemented by any of the details, features and/or functionalities described herein. Furthermore, the embodiments described herein can be used individually and also optionally be supplemented by any of the details and/or features and/or functionalities included in the claims.

Also, it should be noted that individual aspects described herein can be used individually or in combination. Thus, details can be added to each of said individual aspects without adding details to another one of said aspects.

It should be noted that the present disclosure describes, explicitly or implicitly, features usable in a measurement unit with a converter unit and a processing unit. Thus, any of the features described herein can be used in the context of a measurement unit with a converter unit and a processing unit.

The invention will be understood more fully from the detailed description given below and from the accompanying drawing of embodiments of the invention which, however, should not be taken to limit the invention to the specific embodiments described but are for explanation and understanding only.

Figure 1:
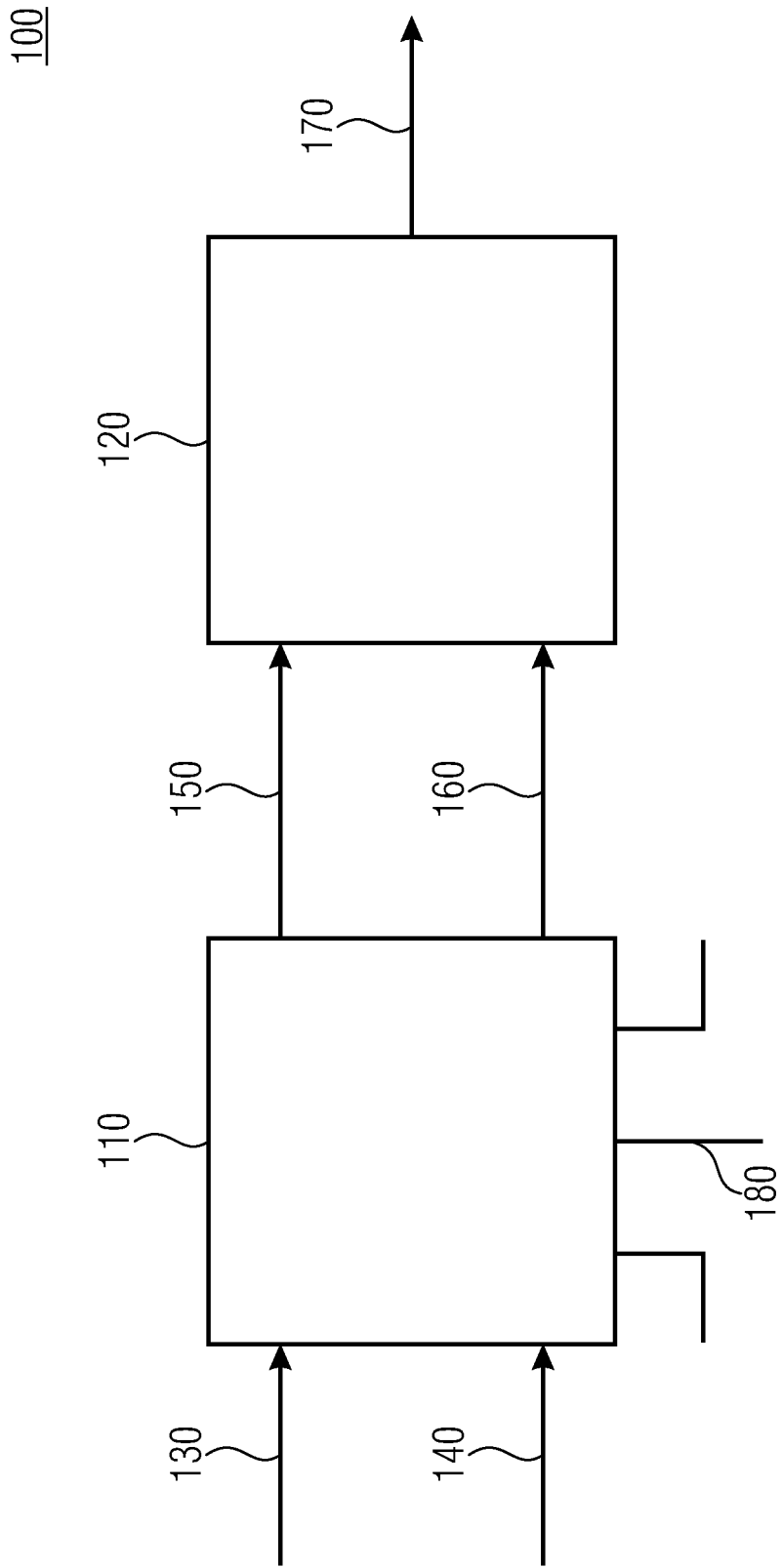
FIG. 1 shows a schematic measurement unit, comprising a converter unit and a processing unit.

Embodiment According to FIG. 1

FIG. 1 shows a schematic block diagram of a measurement unit 100 comprising a converter unit 110 and a processing unit 120. The measurement unit 100 has two input signals, the first input signal 130 and the second input signal 140 and provides one output, a measurement result value 170.

The first input signal 130 and the second input signal 140 are provided to the converter unit 110.

The converter unit 110 provides first digital values 150 and second digital values 160 to the processing unit 120.

The processing unit 120 collects a predefined number of first digital values 150 and a predefined number of second digital values 160 and provides a measurement result value 170 as the output of the measurement unit 100.

The converter unit 110 is configured to provide first digital values 150 based on the first input signal 130 or derived from the first input signal 130 and the second input signal 140. Furthermore, the converter unit 110 is configured to provide second digital values 160 based on the second input signal 140 or is derived from the first input signal 130 and the second input signal 140.

The first digital values 150 and the second digital values 160 are digital values, wherein the quantization step sizes are based on one or more control signals 180 of the converter unit 110.

The measurement unit is configured to change the one or more control signals 180 of the converter unit 110 between a determination of different first values 150 and/or a determination of different second values 160, such that different first values 150 and/or different second values 160 are provided using different quantization step sizes on the basis of the one or more control signals 180.

The processing unit 120 is configured to accumulate a predefined number of first values 150 and a predefined number of second values 160 and to provide the measurement result value 170 from the predefined number of first values 150 and the predefined number of second values 160, wherein an impact of the quantization step sizes onto the first values 150 and onto the second values 160 cancels out, at least partially.

The processing unit 120 is configured to conduct division and averaging operations or averaging and division operations on the first digital values 150 and on the second digital values 160. In the result of the division operation, the different quantization step sizes cancel out from the calculation.

The averaging operation conducted on the predefined number of first values 150 and second values 160 or on a division of these values results in improving the resolution of the measurement result value 170.

In other words, the idea is to turn the measured signals 130, 140 into non-static signals not by modifying the signals themselves but by changing the quantization step sizes. To make the measurement non-static the control signal 180 is changed from measurement to measurement, performing each single measurement with another control signal 180 or quantization step size.

For example, using a TDC as a converter unit, the phase deviation of both clock signals, φ, and not the absolute time values are requested. The final measurement result is calculated as quotient between the time deviation of both clock edges, $T_{edge}$, and the clock period, $T_{period}$:

$$\varphi = 2\pi \frac{T_{edge}}{T_{period}}$$

The quantization step size does not affect the final measurement result because the division of duration cancels out the quantization step sizes. Division is done over a high number of measurements, n, and results in a non-static measurement that is easy to improve. The resolution is improved by a simple averaging over a high number of measurements:

$$\varphi_{average} = \frac{1}{n}\sum_{k=1}^{n}\varphi(k)$$

A final implementation in an application specific integrated circuit (ASIC) can use some optimization to save calculation effort. The converter unit, such as TDC, delivers a series of measurements, n, or measurement pairs, such as a series of first digitized values 150 and second digitized values 160, for example, containing the time difference between both clock's edges, $T_{edges}(k)$, and the clock period, $T_{period}(k)$. The result of each measurement is the quotient of both values (for simplicity, the factor 27 is deducted):

$$r(k) = \frac{T_{edge}(k)}{T_{period}(k)}$$

Averaging over a number of n measurements leads to the following equation:

$$\text{result} = \frac{1}{n} = \sum_{k=1}^{n}r(k) = \frac{1}{n}\sum_{k=1}^{n}\frac{T_{edge}(k)}{T_{period}(k)}$$

The complexity of this calculation is n+1 divisions and n adders.

Since the quotient, r(k) is not an integer value, it is required to use fixed point calculation. Using fixed point calculation reduces the accuracy of the calculation because of the limited number of result bits of each division. The least significant parts of the calculation result gets cut off after each measurement step. In addition to this the division itself is a resource hungry operation that should be avoided.

A simplification can be used by calculating the average of all first digital values and all second digital values separately and then calculate the final result as quotient of both averaging results.

$$\text{result} = \frac{\sum_{k=1}^{n} T_{edge}(k)}{\sum_{k=1}^{n} T_{period}(k)}$$

The complexity of the calculation by n measurement pairs is on division and 2·n adders which is less complex than the first, initial approach.

It can be shown that the above equation is valid for the static use case with:

$$\frac{T_{edge}(k_1)}{T_{period}(k_1)} \approx \frac{T_{edge}(k_2)}{T_{period}(k_2)}$$

The measurement unit is generic and can be used with a TDC and/or an ADC, or with other converters as well.

In a delay stage based TDC with modulated delay stage supply voltage where the final measurement result is a quotient between two time values measured by the TDC in a way that the actual stage delay is cancelled out by the division.

For example, another potential application is an ADC with a modulated control voltage, $V_{ref}$, when the final measurement result is a quotient measured by the ADC in two measurements in a way that the actual quantization step size is cancelled out by the division.

For example, temperature measurement with a temperature dependent resistor usually compares the temperature dependent resitorvalue against a reference resistor. In this application an ADC measures the voltage over the PDC resistor and the voltage over the reference resistor. The quotient between both measurements is the final measurement result. The temperature measurements are often quasi static because temperatures change very slowly. To improve the accuracy, or resolution, the measurement could be done multiple times with a different control voltage of the ADC. The final result would then be computed as the average of all measurements.

Figure 2:
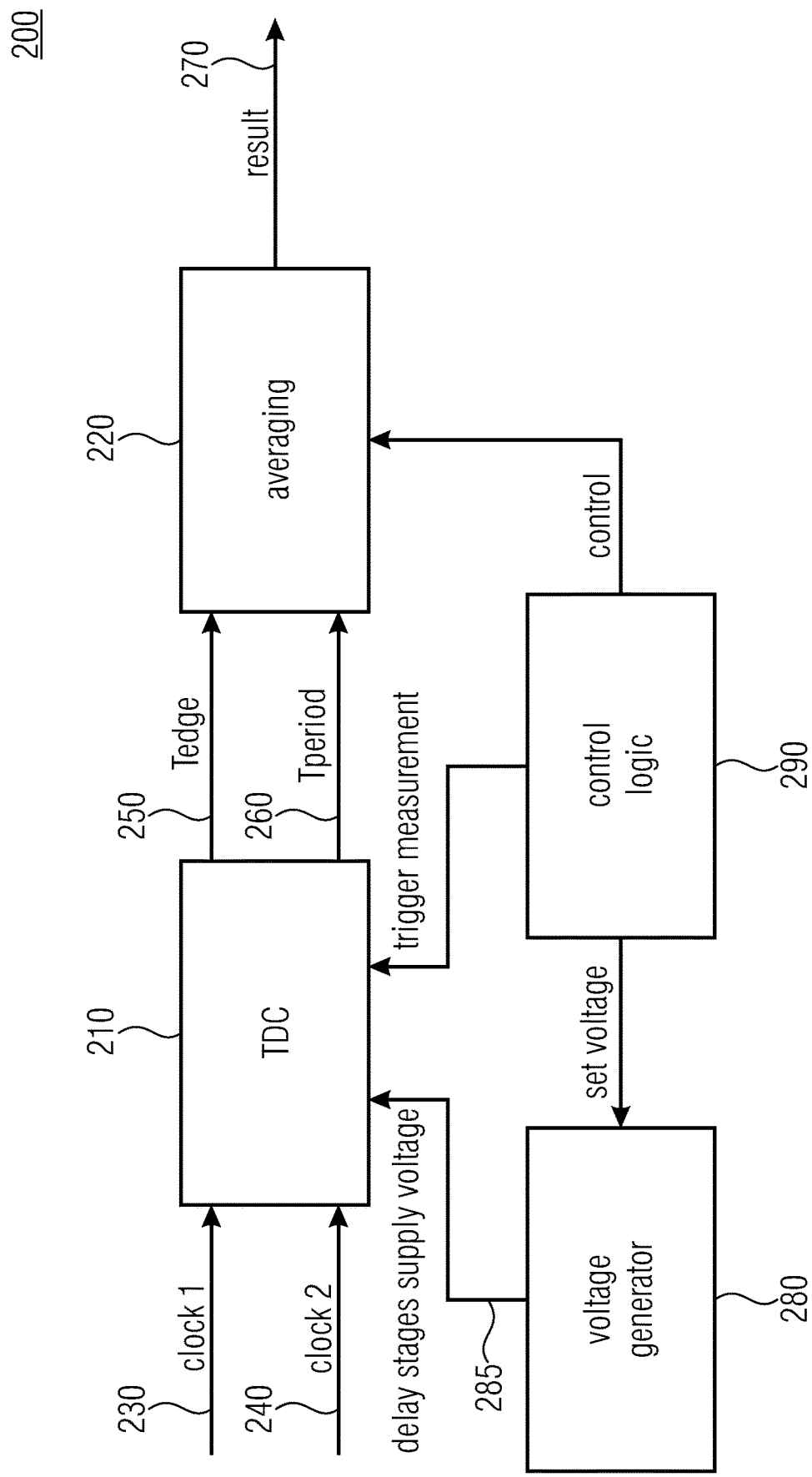
FIG. 2 shows a schematic measurement unit, comprising a converter unit, a processing unit, a control signal generator and a control logic.

Embodiment According to FIG. 2

FIG. 2 shows an extended measurement unit 200, similar to the measurement unit 100 of FIG. 1. The measurement unit 200 comprises a converter unit 210, such as a time-to-digital converter (TDC), a processing unit 220, such as an averaging unit, a control signal generator 280, such as a voltage generator, and a control logic 290. Two inputs, a first input signal 230, such as a first clock signal, and a second input signal 240, such as a second clock signal, are provided to the measurement unit 200. The measurement unit 200 outputs a measurement result value 270.

The first clock signal 230 and the second clock signal 240 are provided to the converter unit 210.

The converter unit 210 is coupled to a control signal generator 280, to a control logic 290, and provides first digital values 250 and second digital values 260 to the processing unit 220.

The processing unit 220 accepts first digital values 250 and second digital values 260 from the converter unit 210 and outputs a measurement result value 270, which is the output value of the measurement unit 200. The processing unit 220 is further coupled to the control logic 290.

The control signal generator 280, which can be a current generator is coupled to the converter unit 210.

The control logic 290 is coupled to the control signal generator 280, the converter unit 210 and the processing unit 220.

The converter unit 210 is configured to provide a time value 250 from an edge of the first input signal 230 to an edge of the second input signal 240 and to provide a second time value 260 of a period of the first input signal 230 or a period of the second input signal 240. The first time value 250 and the second time value 260 are digital values, wherein the quantization step sizes are depending or based on one or more control signals 285.

The processing unit 220, or averaging unit, is configured to provide measurement result value 270 from a predefined number of first digital values 250 and a predefined number of second digital values 260. The processing unit 220 accumulates a predefined number of first digital values 250 and a predefined number of second digital values 260 and conducts a division operation and an averaging operation.

The control signal generator 280, which can be a current or voltage generator, provides a control signal 285 to the converter unit 210 in order to control the quantization step sizes of the first values 250 and of the second values 260.

The modulated control signal 285 of the delay stages of converter unit 210 can be, for example, one of the following signals:
- a ramp signal, increasing and/or decreasing control signal, like the control voltage level, by a small step from measurement to measurement over the period of n measurements and/or
- a triangular signal or a sawtooth signal, increasing and/or decreasing control signal, like the control voltage, periodically up and down over the whole period of n measurements and/or
- a signal generated based on a mathematical function, such as a sine wave, and/or
- a random and/or pseudo-random signal setting a new random value of the delay stage control signal, like the control voltage, at each measurement step and/or
- an arbitrary waveform, or pre-recorded waveform stored in a memory, that is used to modulate the delay stage control signal, like the control voltage.

The control logic 290 is coupled to the control signal generator unit 280, to the converter unit 210, and to the processing unit 220. The control logic 290 is configured to conduct the several operations. The control logic is configured to trigger the control signal generator unit 280 to set a new control signal 285 for the next measurement or measurements. The control unit is configured to trigger a converter unit to conduct a measurement. The control unit is configured to trigger the processing 220 to accumulate the first digital values 250 and the second digital values 260 measured by the converter unit 210. The control unit 290 can repeat the setting of the voltage/current values of the control signal generator 280, the triggering of measurements done by the converter unit, and the triggering value accumulation of the averaging or processing unit 220 until a desired number of measurements is available for an averaging or processing unit 220. As the number of measurement values is equal or higher than a predefined number, the control logic triggers the processing unit 220 to compute the result from the accumulated measurements.

In other words, a measurement unit can be applied in an ASIC. The converter in question can be a TDC which converts the time between the edges of two static clock signals into a digital value. The TDC can be based on a ring oscillator (RO). The TDC measures continuously, or quasi-continuously, the time between an edge of the first clock signal to the edge of the second clock signal. In the same time, the TDC also measures the time of the full clock period of the clock signals. Both measurements can be done simultaneously and the results are in the units of RO stage delay values.

The measurement result value is the phase deviation of both clock signals and not the absolute time values. The final measurement result values are calculated as quotient values between the time deviation of the edges of clocks and the clock periods:

$$\varphi = 2\pi \frac{T_{edge}}{T_{period}}$$

Both values are measured in units of RO stage delay. Thus, dividing both values will cancel the RO stage delay value from the calculation. This is making the TDC self-calibrating because the measurement result does not depend on the RO stage delay.

The resolution of a single measurement of a RO based TDC is determined by the stage delay of a single RO inverter. In some cases, the RO inverter delay can be ~4 ps, which can be the RO measurement resolution. In contradiction to this, in some cases, a resolution of <1 ps is required for the edge delay measurement and for the clock period measurement.

The RO stage delay can be changed in small ranges by varying the supply voltage of the RO's inverter stages. To make the measurement non-static the RO supply voltage is changed from measurement to measurement. Each single measurement is performed with another RO stage delay. The RO stage delay does not affect the final measurement result because of the self-calibrating TDC.

The invention claimed is:

1. An apparatus for providing, a measurement result value based on a first input signal and a second input signal the apparatus comprising:
a measurement unit comprising a converter unit and a processing unit;
wherein the converter unit is configured:
to provide first values, wherein the first values are based on one of: the first input signal; and the first input signal and the second input signal; and
to provide second values, wherein the second values are based on one of: the second input signal; and the first input signal and the second input signal, and
wherein quantization step sizes of a first value of the first values and a second value of the second values are based on one or more control signals of the converter unit,
wherein the measurement unit is configured to change the one or more control signals of the converter unit between a determination of different first values or performing a determination of different second values, and wherein the different first values or the different second values are provided based on different converter quantization step sizes; and
wherein the processing unit is configured to provide the measurement result value from a predefined number of first values and a predefined number of second values, wherein effects of the quantization step sizes on the first and second values cancels out.

2. The apparatus according to claim 1, wherein the second values are determined by measuring the second input signal with a same converter as used for measuring the first input signal.

3. The apparatus according to claim 1, where a quantization step size of the quantization step sizes is calculated from a value of the one or more control signals.

4. The apparatus according to claim 1, wherein the processing unit is configured to determine the measurement result value based on the predefined number of first values and based on the predefined number of second values using an averaging.

5. The apparatus according to claim 1, wherein the processing unit is further configured to average quotient values of the predefined number of first values and the predefined number of second values obtain the measurement result value.

6. The apparatus according to claim 1, wherein the processing unit is further configured to calculate the measurement result value based on a following equation:

$$\text{result} = \frac{1}{n} \cdot \sum_{k=1}^{n} \frac{val_1(k)}{val_2(k)}$$

Wherein:
result represents the measurement result value,
n represents a predefined number of measurements comprising a sum of the predefined number of first values and the predefined number of second values,
$val_1(k)$ represents a k-th element of the predefined number of first values,
$val_2(k)$ represents the k-th element of the predefined number of second values,
k represents a running variable.

7. The apparatus according to claim 1, wherein the processing unit is further configured to calculate a quotient value of a sum of the predefined number of first values and a sum of the predefined number of second values.

8. The apparatus according to claim 1, wherein the processing unit is further configured to calculate the measurement result value based on a following equation:

$$\text{result} = \frac{\sum_{k=1}^{n} val_1(k)}{\sum_{k=1}^{n} val_2(k)}$$

Wherein:
result represents the measurement result value,
n represents a predefined number of measurements comprising a sum of the predefined number of first values and the predefined number of second values,
$val_1(k)$ represents a k-th element of the predefined number of first values,
$val_2(k)$ represents the k-th element of the predefined number of second values,
k represents a running variable.

9. The apparatus according to claim 1, wherein the one or more control signals are voltage signals.

10. The apparatus according to claim 1, wherein the one or more control signals comprise one or more of a group including:
an increasing and/or decreasing ramp signal,
a periodically increasing and decreasing triangular signal,
a signal based on a mathematical function, a random or pseudo-random signal and,
an arbitrary waveform stored in a memory.

11. The apparatus according to claim 1, wherein the measurement unit further comprises a control signal generator.

12. The apparatus according to claim 1, wherein the measurement unit further comprises a control logic configured to control one of: the converter unit; the processing unit; and the one or more control signals.

13. The apparatus according to claim 1, wherein the first input signal and the second input signal are constant over a predefined number of measurements.

14. The apparatus according to claim 1, wherein the converter unit comprises a time-to-digital converter.

15. The apparatus according to claim 1, wherein the converter unit comprises a time-to-digital converter, and wherein the converter unit is configured to provide in an alternative operation:
time values from an edge of the first input signal to an edge of the second input signal, and
time values of a period of the first input signal or a period of the second input signal.

16. The apparatus according to claim 15, wherein quantization step sizes of a time value of a period of either the first input signal or of the second input signal, and the time value between the edge of the first input signal and the edge of the second input signal are varied.

17. The apparatus according to claim 15, wherein the measurement result value comprises a phase deviation between the first input signal and the second input signal.

18. The apparatus according to claim 15, wherein the first input signal and the second input signal are clock signals.

19. The apparatus according to claim 15, wherein a frequency of the first input signal and a frequency of the second input signal are substantially similar.

20. The apparatus according to claim 15, wherein the one or more control signals of the converter unit change a time unit.

21. The apparatus according to claim 15, wherein the one or more control signals of the converter unit varies frequency of one or more oscillator which act as a time reference.

22. The apparatus according to claim 15, wherein the one or more control signals of the converter unit varies an electrical supply signal of an oscillator to vary the quantization step sizes.

23. The apparatus according to claim 15, wherein the converter unit comprises a plurality of delay stages.

24. The apparatus according to claim 23, wherein the one or more control signals of the converter unit varies a delay of a plurality of delay stages to vary the quantization step sizes.

25. The apparatus according to claim 15, wherein the quantization step sizes are varied by at least 50%.

26. The apparatus according to claim 15, wherein the quantization step sizes are varied, and wherein either a digitized first value associated with a stationary first signal or a digitized second value associated with a stationary second signal change in response to a change of a quantization step size.

27. The apparatus according to claim 1, wherein the converter unit comprises an analog-to-digital converter operable to provide first voltage or current values from the first input signal and second voltage values or current values from the second input signal.

28. The apparatus according to claim 27, wherein a quantization step size of the first voltage values or the second voltage values are varied.

29. The apparatus according to claim 27, wherein the measurement result value is a quotient value.

30. The apparatus according to claim 27, wherein the first input signal is a voltage signal and the second input signal is a voltage signal.

31. The apparatus according to claim 27, wherein the one or more control signals of the converter unit change a voltage reference.

32. The apparatus according to claim 27, wherein the one or more control signals of the converter unit varies a supply voltage of an analog-to-digital converter to vary the quantization step sizes.

33. The apparatus according to claim 27, wherein the quantization step sizes are varied by at least 50%.

34. The apparatus according to claim 27, wherein the quantization step sizes are varied, and wherein either the first voltage values or current values associated with a stationary first signal or the second voltage values or current values associated with a stationary second signal in response to a change of the quantization step sizes.

35. A system for determining a measurement result value based on a first input signal and a second input signal, the system comprising:
a measurement unit comprising a converter unit and a processing unit,
wherein the converter unit is configured to provide first values, wherein the first values are based on one of: the first input signal; and the first input signal and the second input signal, and to provide second values, wherein the second values are based on one of: the second input signal; and the first input signal and the second input signal, and wherein quantization step sizes associated with the first values and the second values are based on one or more control signals of the converter unit,
wherein the measurement unit is configured to change the one or more control signals of the converter unit between operating to determine different first values or to determine different second values, wherein the different first values or the different second values are provided using different converter quantization step sizes, and
wherein the processing unit is configured to provide the measurement result value from a predefined number of first values and a predefined number of second values, wherein effects of the quantization step sizes on the first and second values substantially cancel out.

36. A method of providing a measurement result value based on a first input signal and a second input signal, the method comprising:
providing first values, wherein the first values are based on either the first input signal or on the first input signal and the second input signal, and wherein the second values are derived from the first input signal and the second input signal, and wherein a quantization step size associated with a first value of the first values and a second value of the second values is based on one or more control signals of a converter unit;
changing the one or more control signals of the converter unit alternating between forming a determination of different first values and forming a determination of different second values, wherein different first values or the different second values are provided using different converter quantization step sizes; and providing the measurement result value from a predefined number of first values and a predefined number of second values, wherein effects of the different converter quantization step sizes on the first and second values cancel out, at least partially.

* * * * *